United States Patent
Endo et al.

(10) Patent No.: US 7,470,501 B2
(45) Date of Patent: Dec. 30, 2008

(54) PATTERN FORMATION METHOD THROUGH LIQUID IMMERSION LITHOGRAPHY

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 457 days.

(21) Appl. No.: 11/203,161

(22) Filed: Aug. 15, 2005

(65) Prior Publication Data

US 2006/0051709 A1  Mar. 9, 2006

(30) Foreign Application Priority Data

Sep. 7, 2004  (JP) ............................ 2004-259769

(51) Int. Cl.
G03C 5/00 (2006.01)
(52) U.S. Cl. ...................... 430/302; 430/309; 430/311; 430/322; 430/330; 430/945
(58) Field of Classification Search ................. 430/302, 430/309, 311, 322, 330, 945
See application file for complete search history.

(56) References Cited

U.S. PATENT DOCUMENTS

| | | | |
|---|---|---|---|
| 7,070,915 B2 * | 7/2006 | Ho et al. | 430/322 |
| 7,169,530 B2 * | 1/2007 | Kishimura et al. | 430/270.1 |
| 2006/0154188 A1 * | 7/2006 | Hirayama et al. | 430/338 |

FOREIGN PATENT DOCUMENTS

| | | |
|---|---|---|
| CN | 1700098 A | 11/2005 |
| CN | 1757096 A | 4/2006 |
| EP | 0 605 103 A1 | 7/1994 |
| EP | 1 598 705 A1 | 11/2005 |
| EP | 1 601 008 A1 | 11/2005 |
| EP | 1 672 682 A1 | 6/2006 |
| JP | 2004-2324 | 1/2004 |
| WO | WO 2005/024325 | 3/2005 |
| WO | WO 2005/067011 | 7/2005 |

OTHER PUBLICATIONS

Switkes, M., et al. "Immersion lithography at 157nm." J. Vac. Sci. Technol., vol. B19, 2001 pp. 2353-2356.
European Search Report, issued in corresponding Application No. EP 05 018106, dated on Sep. 9, 2007.
Chinese Office Action, with English translation, issued in Japanese Patent Application No. CN 200510099184.2 dated on Aug. 8, 2008.
Tanaka et al "Freeze-Drying Process to Avoid Resist Pattern collapse" Jpn J. Phys. vol. 32 (1993) pp. 5813-5814, Part 1, No. 12A, Dec. 1993.

* cited by examiner

*Primary Examiner*—Christopher G Young
(74) *Attorney, Agent, or Firm*—McDermott Will & Emery LLP

(57) ABSTRACT

An exposure system includes an exposure section provided within a chamber for irradiating a resist film formed on a wafer with exposing light through a mask with an immersion liquid provided on the resist film. It further includes a drying section for drying the surface of the resist film after the irradiation.

14 Claims, 9 Drawing Sheets ns method through
liquid immersion lithography

CROSS-REFERENCE TO RELATED APPLICATIONS

This application claims priority under 35 U.S.C. §119 on Patent Application No. 2004-259769 filed in Japan on Sep. 7, 2004, the entire contents of which are hereby incorporated by reference.

BACKGROUND OF THE INVENTION

The present invention relates to an exposure system for use in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Now, a conventional pattern formation method employing the immersion lithography will be described with reference to FIGS. 8A through 8D.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Next, as shown in FIG. 8A, the aforementioned chemically amplified resist material is applied on a substrate 1 so as to form a resist film 2 with a thickness of 0.35 μm.

Then, as shown in FIG. 8B, with water 3 for immersion lithography provided on the resist film 2, pattern exposure is carried out by irradiating the resist film 2 with exposing light 4 of ArF excimer laser with NA of 0.68 through a mask 5.

After the pattern exposure, as shown in FIG. 8C, after discharging the water 3 for immersion lithography, the resist film 2 is baked with a hot plate at a temperature of 110° C. for 60 seconds, and the resultant resist film is developed with a 0.26 N tetramethylammonium hydroxide developer. In this manner, a resist pattern 2a made of an unexposed portion of the resist film 2 is formed as shown in FIG. 8D.

As shown in FIG. 8D, however, the resist pattern 2a formed by the conventional pattern formation method is in a defective shape.

SUMMARY OF THE INVENTION

The present inventors have variously examined the reason why the resist pattern 2a formed by the conventional immersion lithography is in a defective shape, resulting in finding the following:

The conventional pattern is in a defective shape because the water 3 used for immersion lithography, which has been discharged from above the resist film 2 after the exposure, still remains on the resist film 2 after the exposure, and remaining drops of the water 3 deteriorate the resist. This deterioration of the resist is caused through contact between the remaining drops and the resist, and the influence of the remaining drops increases with time. Also, it has been found that if the resist film 2 is subjected to the post exposure bake with the drops remaining thereon, the resist is more largely deteriorated.

The resist is deteriorated by the drops as follows:

In general, a resist is made of a material minimally dissolved in a water-soluble liquid, and a very small amount of liquid does not easily permeate into the resist film through its surface before the exposure. At this point, FIG. 9A schematically shows an example of a plan structure of an exposed resist pattern composed of line patterns 20a and hole patterns 20b and formed on a substrate 10 with an insulating film 15 sandwiched therebetween. FIG. 9B is a schematic cross-sectional view taken on line IXb-IXb of FIG. 9A. As shown in FIG. 9A, the chemical state of the surface of the exposed resist film 20 is largely different from that attained before the exposure, and the line patterns 20a and the hole patterns 20b corresponding to exposed portions where an acid is generated through the exposure and an unexposed portion 20c (where no acid is generated) are present in a mixed manner in accordance with the layout of mask patterns.

Immediately after the exposure, a portion where the largest amount of acid has been generated on the resist film 20 is the surface of the exposed portions 20a and 20b of the resist film 20, and the acid in an amount necessary and sufficient for development is not always generated in the whole exposed portions immediately after the exposure. Accordingly, if a small amount of liquid remains on the surface of the resist film 20 immediately after the exposure, the acid elutes from the surfaces of the exposed portions 20a and 20b, where the largest amount of acid is present, into a remaining drop 30 of the liquid as shown in FIG. 9B. Furthermore, the drop 30 spreads between and partially covers adjacent exposed portions 20a as shown in FIG. 9B, so as to cause a situation (phenomenon) that a larger amount of acid is eluted from the exposed portions 20a and the acid is supplied also onto the unexposed portion 20c. As a result, the pattern is formed in a defective shape because part of the exposed portions 20a and 20b does not dissolve in the development or part of the unexposed portion 20c dissolves in the developer. In particular, when the pattern is refined in such a manner that, for example, the distance between the line patterns 20a is 0.25 μm or less or the size of the hole pattern is 0.30 μm or less, even a small amount of liquid spreads over adjacent line patterns 20a. Furthermore, even when a small amount of acid is eluted owing to the drops, the solubility in the developer is largely lowered if the pattern size is smaller.

When the resist pattern in such a defective shape is used for etching a target film, the resultant pattern of the target film is also in a defective shape, and hence, the productivity and the yield of the fabrication process for semiconductor devices are disadvantageously lowered.

In consideration of the aforementioned conventional problem, an object of the invention is forming a fine pattern in a good shape by preventing a resist film from being deteriorated by drops of a liquid having been used for immersion lithography.

In order to achieve the object, according to the present invention, in the exposure system and the pattern formation method employing the immersion lithography, an immersion liquid is discharged after pattern exposure, and remaining drops of the immersion liquid are removed and dried so that none of the immersion liquid can remain on a resist film.

Specifically, the exposure system of this invention includes an exposure section for irradiating a formed resist film with exposing light through a mask with an immersion liquid provided on the resist film; and a drying section for drying a surface of the resist film after irradiation.

In the exposure system of this invention, since the immersion liquid does not remain on the surface of the exposed resist film, the resist film can be prevented from being deteriorated by remaining drops of the liquid. Accordingly, when the resist film is developed in a development system thereafter, degradation of a pattern shape derived from insufficient dissolution in a developer or unwanted dissolution of an insoluble portion can be prevented in an exposed portion or an unexposed portion of the exposed resist film, resulting in obtaining a resist pattern in a good shape.

In the exposure system of the invention, the drying section preferably includes air blowing means.

In the exposure system of the invention, the drying section preferably includes dehumidification means.

In the exposure system of the invention, the drying section preferably includes warming means.

In the exposure system of the invention, the resist film is preferably formed on a wafer, and the drying section preferably dries a whole top surface of the wafer.

In this case, the exposure section preferably includes twin stages having at least two wafer placing portions, and the whole top surface of the wafer is preferably dried on one of the wafer placing portions of the twin stages.

In the exposure system of the invention, the air blowing means is preferably an air fan capable of blowing warm air.

In the exposure system of the invention, the dehumidification means can be a dehumidification apparatus for lowering humidity of an environment around the resist film by using a refrigerant. The refrigerant can be a hydrocarbon-based gas such as isobutane, butane, propane or cyclopropane, and the refrigerant is circulated through a compressor.

In the exposure system of the invention, the dehumidification means can be a drying agent for lowering humidity of an atmosphere around the resist film. An example of the drying agent is desiccant, and such a drying agent adsorbs moisture contained in the atmosphere for dehumidification.

In the exposure system of the invention, the warming means can be a warming apparatus for warming an atmosphere around the resist film.

The first pattern formation method of this invention includes the steps of forming a resist film on a substrate; performing pattern exposure by selectively irradiating the resist film with exposing light with an immersion liquid provided on the resist film; removing the immersion liquid remaining on a surface of the resist film after the pattern exposure; and forming a resist pattern by developing the resist film after removing the immersion liquid.

In the first pattern formation method, the resist film can be prevented from being deteriorated by the remaining drops of the immersion liquid. Therefore, degradation of the pattern shape derived from insufficient dissolution in a developer or unwanted dissolution of an insoluble portion can be prevented in an exposed portion or an unexposed portion of the resist film, resulting in obtaining the resist pattern in a good shape.

In the first pattern formation method, the step of removing the immersion liquid is preferably a step of blowing air against the resist film after the pattern exposure, a step of dehumidifying an atmosphere around the resist film after the pattern exposure, or a step of warming the resist film after the pattern exposure.

The second pattern formation method of this invention includes the steps of forming a resist film on a substrate; performing pattern exposure by selectively irradiating the resist film with exposing light with an immersion liquid provided on the resist film; blowing air against the resist film after the pattern exposure; and forming a resist pattern by developing the resist film after blowing air against the resist film.

In the second pattern formation method, even when drops of the immersion liquid remain on the resist film after discharging the immersion liquid after the pattern exposure, the drops are evaporated by blowing the air and the surface of the resist film is dried, and therefore, the resist film can be prevented from being deteriorated by the drops. Accordingly, degradation of the pattern shape derived from insufficient dissolution in a developer or unwanted dissolution of an insoluble portion can be prevented in an exposed portion or an unexposed portion of the resist film, resulting in obtaining the resist pattern in a good shape.

The third pattern formation method of this invention includes the steps of forming a resist film on a substrate; performing pattern exposure by selectively irradiating the resist film with exposing light with an immersion liquid provided on the resist film; dehumidifying an atmosphere around the resist film after the pattern exposure; and forming a resist pattern by developing the resist film after dehumidification.

In the third pattern formation method, even when drops of the immersion liquid remain on the resist film after discharging the immersion liquid after the pattern exposure, the drops are evaporated by dehumidifying the atmosphere around the resist film and the surface of the resist film is dried, and therefore, the resist film can be prevented from being deteriorated by the drops. Accordingly, degradation of the pattern shape derived from insufficient dissolution in a developer or unwanted dissolution of an insoluble portion can be prevented in an exposed portion or an unexposed portion of the resist film, resulting in obtaining the resist pattern in a good shape.

The fourth pattern formation method of this invention includes the steps of forming a resist film on a substrate; performing pattern exposure by selectively irradiating the resist film with exposing light with an immersion liquid provided on the resist film; warming the resist film after the pattern exposure; and forming a resist pattern by developing the resist film after warming the resist film.

In the fourth pattern formation method, even when drops of the immersion liquid remain on the resist film after discharging the immersion liquid after the pattern exposure, the drops are evaporated by warming the resist film and the surface of the resist film is dried, and therefore, the resist film can be prevented from being deteriorated by the drops. Accordingly, degradation of the pattern shape derived from insufficient dissolution in a developer or unwanted dissolution of an insoluble portion can be prevented in an exposed portion or an unexposed portion of the resist film, resulting in obtaining the resist pattern in a good shape.

In the second pattern formation method of the invention, the air is preferably warm air.

In the third pattern formation method of the invention, the atmosphere is dehumidified preferably by using a refrigerant.

In the fourth pattern formation method of the invention, the atmosphere is dehumidified preferably by using a drying agent.

In any of the first through fourth pattern formation methods of the invention, the immersion liquid can be water or perfluoropolyether.

In any of the first through fourth pattern formation methods of the invention, the exposing light can be KrF excimer laser, $Xe_2$ laser, ArF excimer laser, $F_2$ laser, KrAr laser or $Ar_2$ laser.

BRIEF DESCRIPTION OF THE DRAWINGS

FIGS. 9A and 9B are diagrams of a resist pattern obtained after exposure by employing the immersion lithography for explaining a problem to be solved by the invention, wherein FIG. 9A is a schematic plan view of the resist pattern and FIG. 9B is a cross-sectional view thereof taken on line IXb-IXb of FIG. 9A.

DETAILED DESCRIPTION OF THE INVENTION

Embodiment 1

Embodiment 1 of the invention will now be described with reference to the accompanying drawings.

Figure 1A:
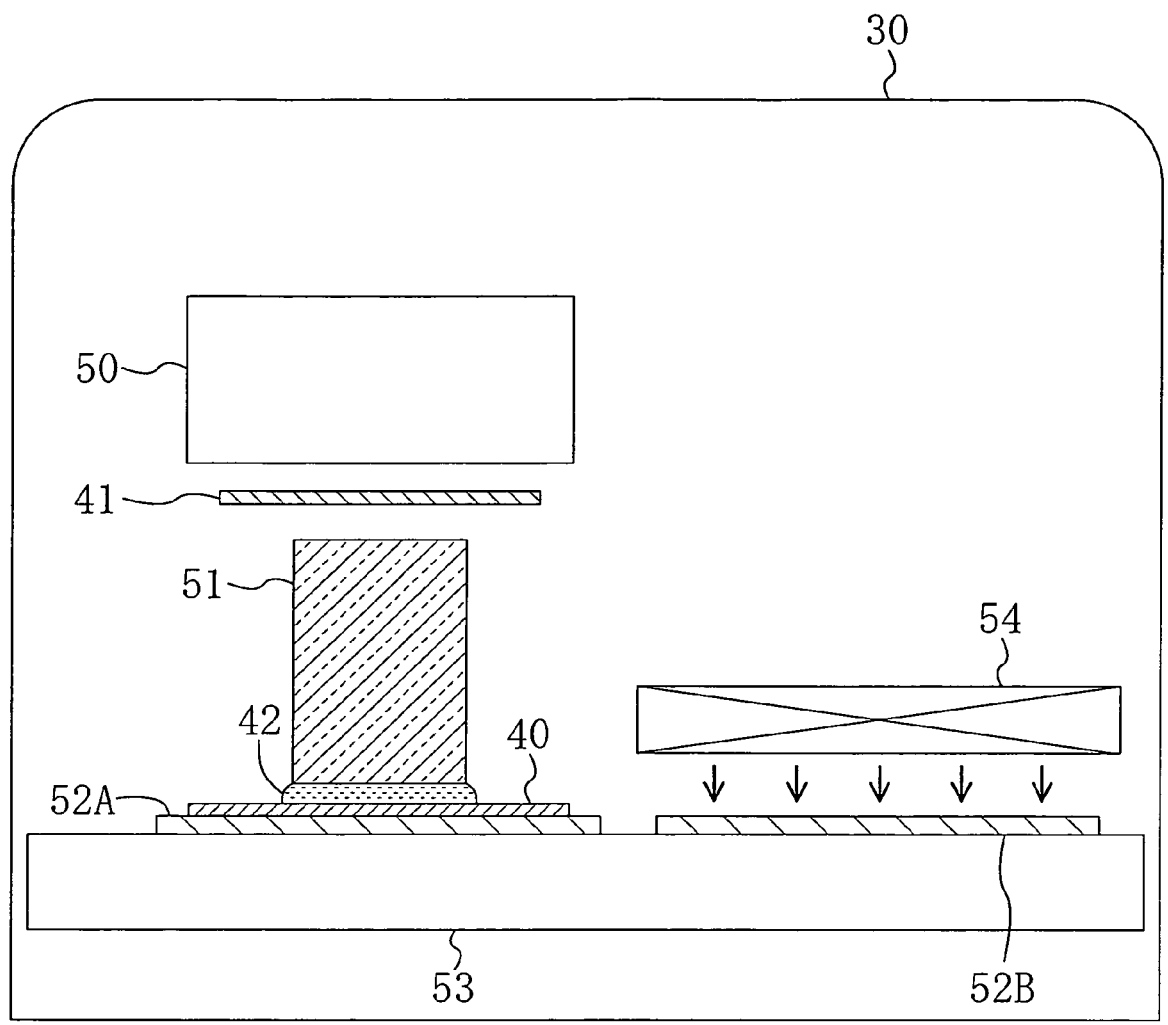
FIG. 1A is a cross-sectional view of a principal part of an exposure system according to Embodiment 1 of the invention.
Figure 1B:
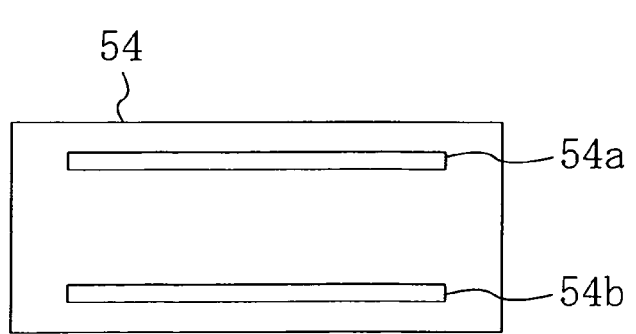
FIG. 1B is a plan view of an air fan provided in the exposure system of Embodiment 1 of the invention.

FIG. 1A schematically shows the cross-sectional structure of a principal part of an exposure system used for realizing a pattern formation method employing immersion lithography according to Embodiment 1 of the invention and FIG. 1B schematically shows the plan structure of an air fan provided in the exposure system.

As shown in FIG. 1A, the exposure system of Embodiment 1 includes an illumination optical system 50, that is, an exposure section provided within a chamber 30, corresponding to a light source for exposing a design pattern on a resist film (not shown) applied on a wafer 40; a projection lens 51 provided below the illumination optical system 50 for projecting, through an immersion liquid 42 onto the resist film, exposing light emitted from the illumination optical system 50 and entering through a mask (reticle) 41 having the design pattern to be transferred onto the resist film; and a first wafer stage 52A for holding the wafer 40. The projection lens 51 is held so as to be in contact with the surface of the immersion liquid 42 supplied onto the resist film formed on the wafer 40 during exposure.

The first wafer stage 52A is held on a surface plate 53, and the surface plate 53 has what is called twin stages in which a second wafer stage 52B is provided on the side of the first wafer stage 52A. The surface plate 53 may have three or more wafer stages.

As a characteristic of Embodiment 1, an air fan 54 corresponding to a drying section capable of blowing warm air is provided above the second wafer stage 52B of the surface plate 53.

FIG. 1B is a plan view of the air fan 54. As shown in FIG. 1B, a draft port 54a in the shape of a slit penetrating the air fan 54 in the vertical direction and an exhaust port 54b extending in parallel to the draft port 54a are provided on the top face of the air fan 54. Although not shown in the drawing, the exhaust port 54b is communicated with another exhaust port for discharging the air to the outside of the chamber 30.

It is not always necessary to provide the air fan 54 above the second wafer stage 52B but it may be provided on the side of the second wafer stage 52B (the surface plate 53) so that the air can blow from the side of the wafer 40 along a direction substantially parallel to the principal surface. Alternatively, it is not always necessary to provide the air fan 54 within the chamber 30 but it may be provided outside the chamber 30.

Now, a pattern formation method using the exposure system of FIGS. 1A and 1B will be described with reference to FIGS. 2A through 2C, 3A and 3B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 2A:
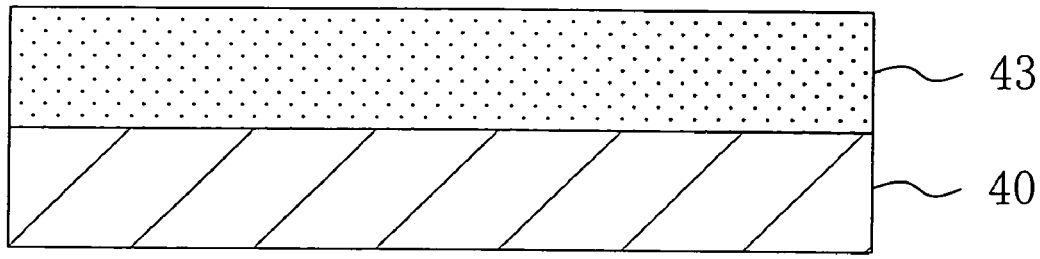
FIGS. 2A, 2B and 2C are cross-sectional views for showing procedures in a pattern formation method using the exposure system of Embodiment 1 of the invention.

Next, as shown in FIG. 2A, the aforementioned chemically amplified resist material is applied on a wafer 40 so as to form a resist film 43 with a thickness of 0.35 μm.

Figure 2B:
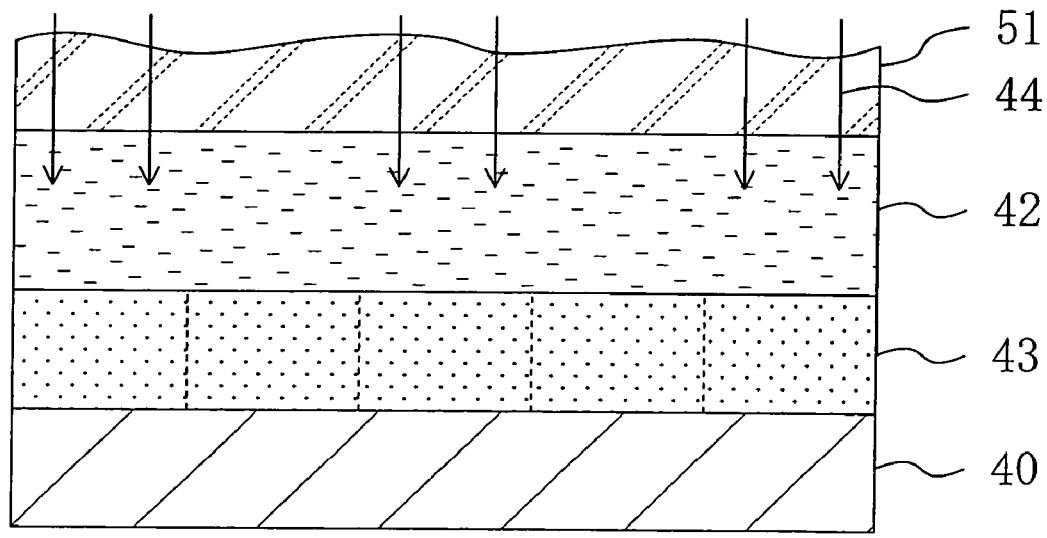

Then, as shown in FIG. 2B, with an immersion liquid 42 of water provided between the resist film 43 and a projection lens 51, pattern exposure is carried out by irradiating the resist film 43 through a mask (not shown) with exposing light 44 of ArF excimer laser with NA of 0.68.

Figure 2C:
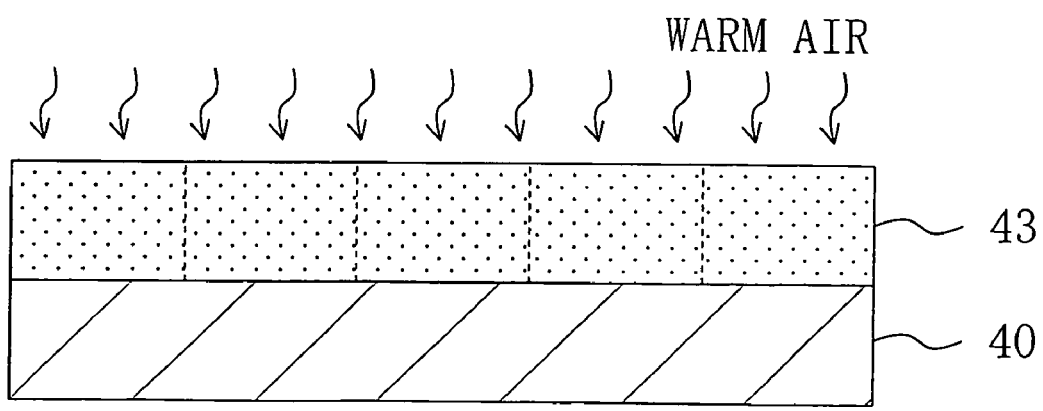

After discharging the liquid 42 from above the resist film 43, the wafer 40 is moved to be positioned below the air fan 54 of FIG. 1A. Thereafter, the top face of the resist film 43 is exposed to the warm air of a temperature of approximately 35° C. as shown in FIG. 2C, thereby drying drops of the liquid remaining on the top face of the exposed resist film 43.

Figure 3A:
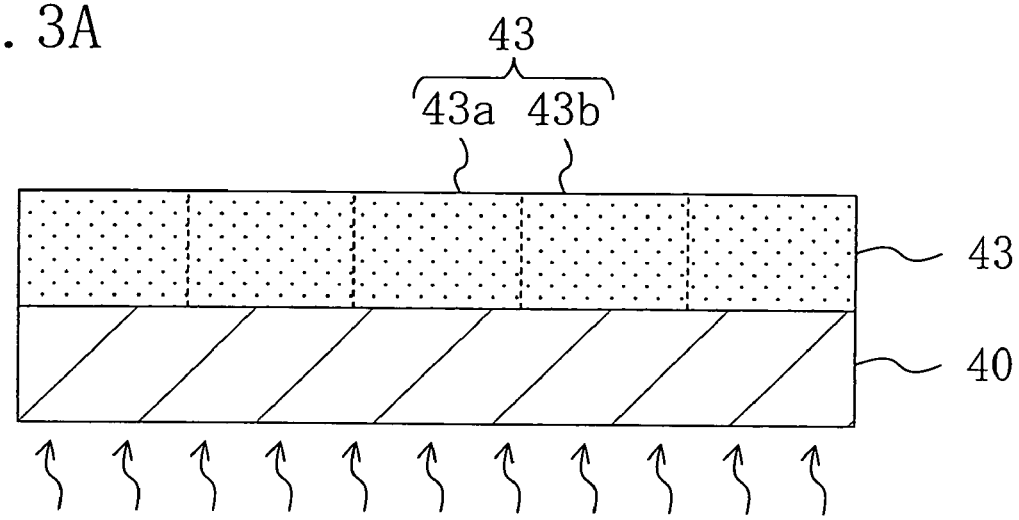
FIGS. 3A and 3B are cross-sectional views for showing other procedures in the pattern formation method using the exposure system of Embodiment 1 of the invention.
Figure 3B:
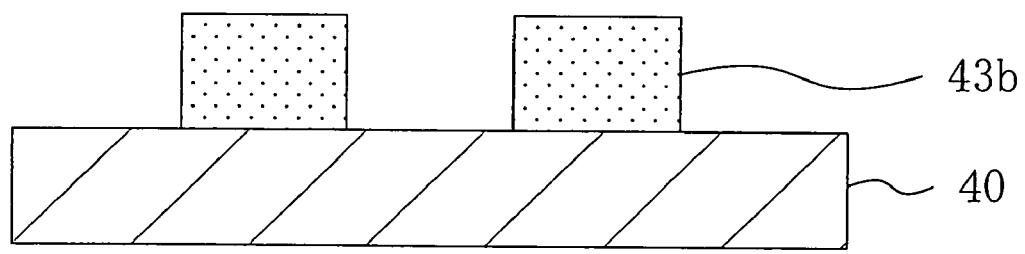

Next, as shown in FIG. 3A, the resist film 43, whose surface has been dried after the exposure, is baked with a hot plate at a temperature of 105° C. for 60 seconds, and thereafter, the resultant resist film 102 is developed with a 0.26 N tetramethylammonium hydroxide aqueous solution (alkaline developer). In this manner, a resist pattern 43b made of an unexposed portion of the resist film 43 and having a line width of 0.09 μm is formed as shown in FIG. 3B.

In this manner, according to the pattern formation method of Embodiment 1, after the pattern exposure through the immersion liquid 42, the drops remaining on the resist film 43 are dried and removed by using the warm air, and therefore, the resist film 43 can be prevented from being deteriorated by the drops after the exposure. Accordingly, degradation of the pattern shape derived from insufficient dissolution in the developer of an exposed portion 43a of the resist film 43 or unwanted dissolution of the unexposed portion can be prevented, resulting in obtaining the resist pattern 43b in a good shape.

The temperature of the warm air blown by the air fan 54 is preferably, for example, not less than room temperature (23° C.) and not more than 60° C., which does not limit the invention.

Embodiment 2

Now, a pattern formation method according to Embodiment 2 of the invention will be described with reference to FIGS. 4A through 4C, 5A and 5B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 4A:
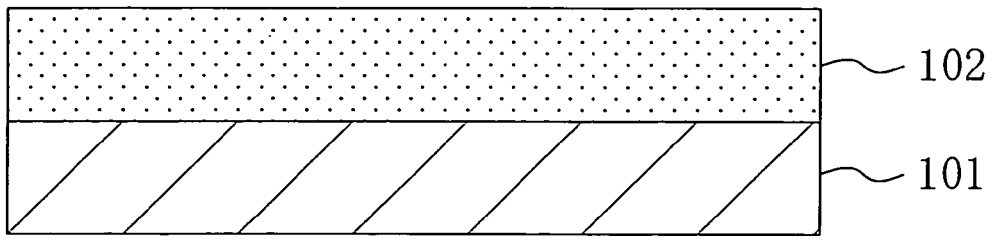
FIGS. 4A, 4B and 4C are cross-sectional views for showing procedures in a pattern formation method using an exposure system according to Embodiment 2 of the invention.

Next, as shown in FIG. 4A, the aforementioned chemically amplified resist material is applied on a wafer (substrate) 101 so as to form a resist film 102 with a thickness of 0.35 μm.

Figure 4B:
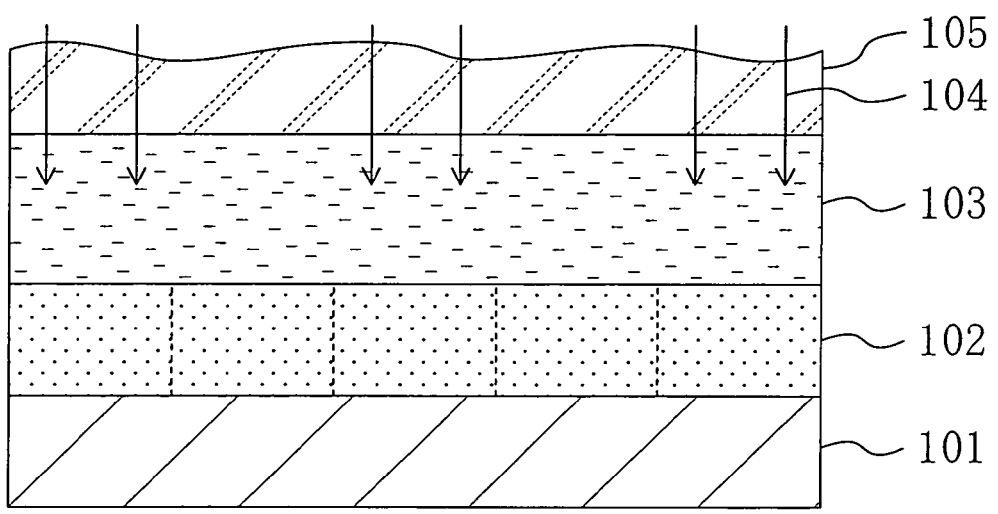

Then, as shown in FIG. 4B, with an immersion liquid 103 of water provided between the resist film 102 and a projection lens 105, pattern exposure is carried out by irradiating the resist film 102 through a mask (not shown) with exposing light 104 of ArF excimer laser with NA of 0.68.

Figure 4C:
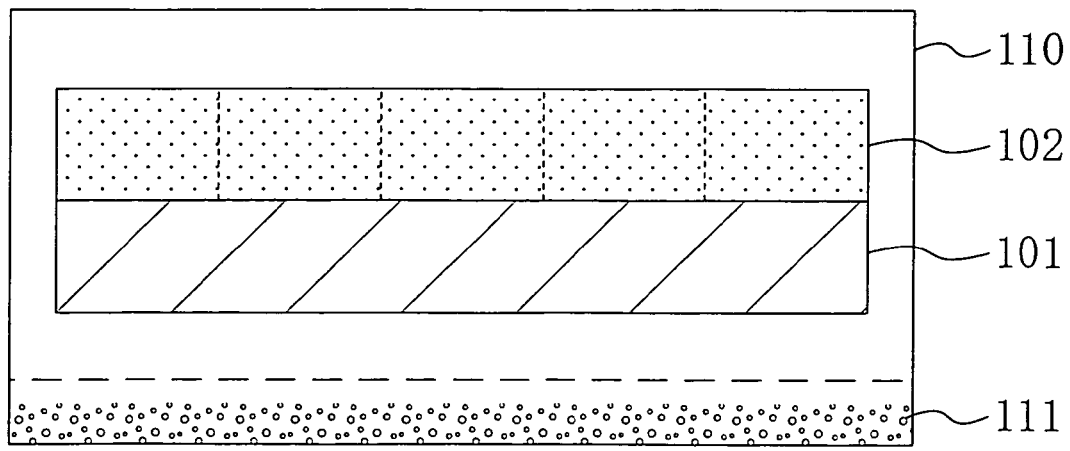

Next, as shown in FIG. 4C, after discharging the liquid 103 from above the resist film 102, the wafer 101 is moved to be placed in a dehumidification vessel 110 provided with a drying agent 111 such as desiccant. At this point, the inside atmosphere of the dehumidification vessel 110 is dehumidified by the drying agent 111 contained therein, and therefore, drops of the liquid remaining on the top face of the exposed resist film 102 are dried.

Figure 5A:
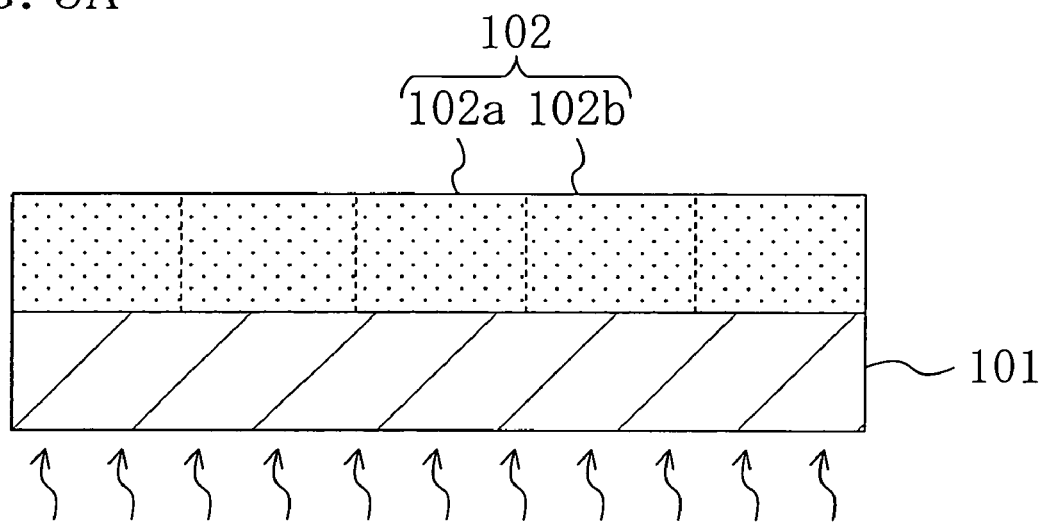
FIGS. 5A and 5B are cross-sectional views for showing other procedures in the pattern formation method using the exposure system according to Embodiment 2 of the invention.
Figure 5B:
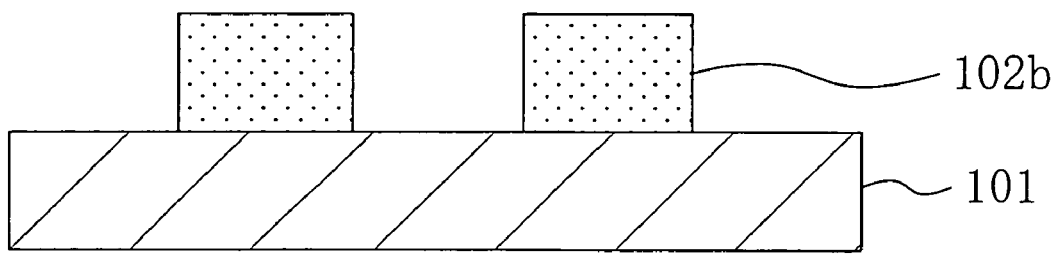

Next, as shown in FIG. 5A, the resist film 102, whose surface has been dried after the exposure, is baked with a hot plate at a temperature of 105° C. for 60 seconds, and thereafter, the resultant resist film 102 is developed with a 0.26 N tetramethylammonium hydroxide aqueous solution (alkaline developer). In this manner, a resist pattern 102b made of an unexposed portion of the resist film 102 and having a line width of 0.09 μm is formed as shown in FIG. 5B.

In this manner, according to the pattern formation method of Embodiment 2, after the pattern exposure through the immersion liquid 103, the remaining drops on the resist film 102 are dried through the dehumidification, and therefore, the resist film 102 can be prevented from being deteriorated by the drops after the exposure. Accordingly, degradation of the pattern shape derived from insufficient dissolution in the developer of an exposed portion 102a of the resist film 102 or unwanted dissolution of the unexposed portion can be prevented, resulting in obtaining the resist pattern 102b in a good shape.

The drying agent 111 is not limited to the desiccant. Also, the dehumidification means is not limited to the drying agent 111, but for example, a compressor system in which moisture vapor within an atmosphere is set by using a cooler containing a refrigerant may be used for the dehumidification.

Embodiment 3

Now, a pattern formation method according to Embodiment 3 of the invention will be described with reference to FIGS. 6A through 6C, 7A and 7B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 6A:
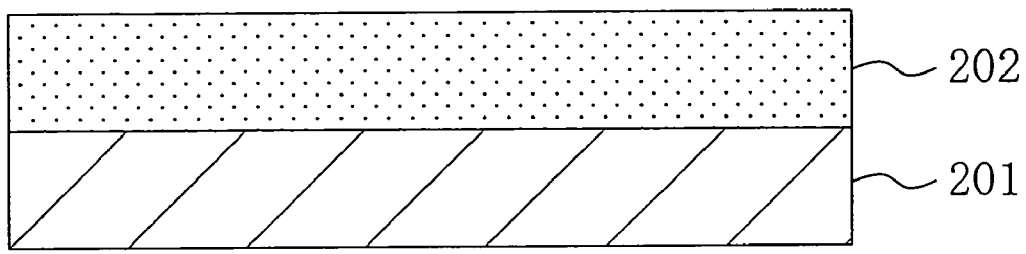
FIGS. 6A, 6B and 6C are cross-sectional views for showing procedures in a pattern formation method using an exposure system according to Embodiment 3 of the invention.

Next, as shown in FIG. 6A, the aforementioned chemically amplified resist material is applied on a wafer (substrate) 201 so as to form a resist film 202 with a thickness of 0.35 μm.

Figure 6B:
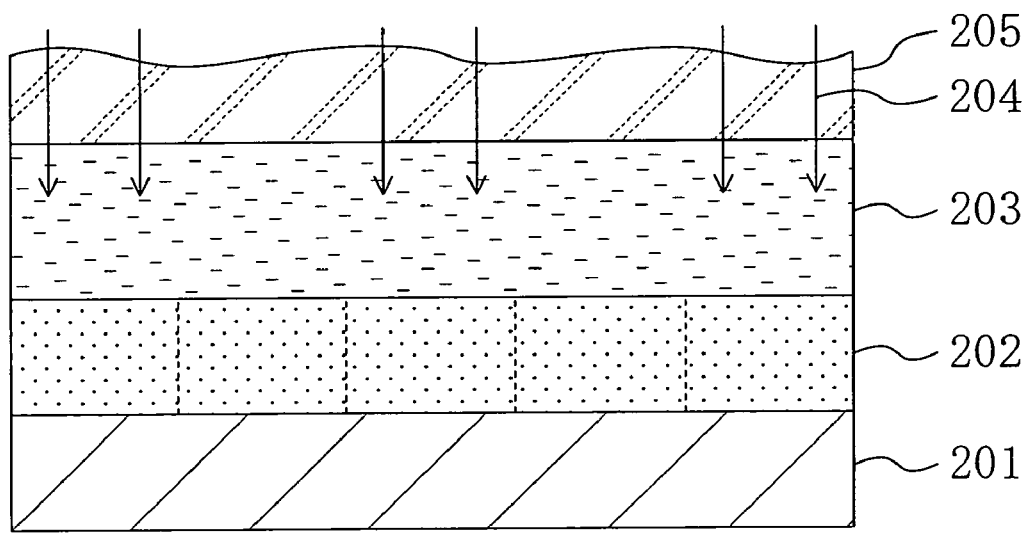

Then, as shown in FIG. 6B, with an immersion liquid 203 of water provided between the resist film 202 and a projection lens 205, pattern exposure is carried out by irradiating the resist film 202 through a mask (not shown) with exposing light 204 of ArF excimer laser with NA of 0.68.

Figure 6C:
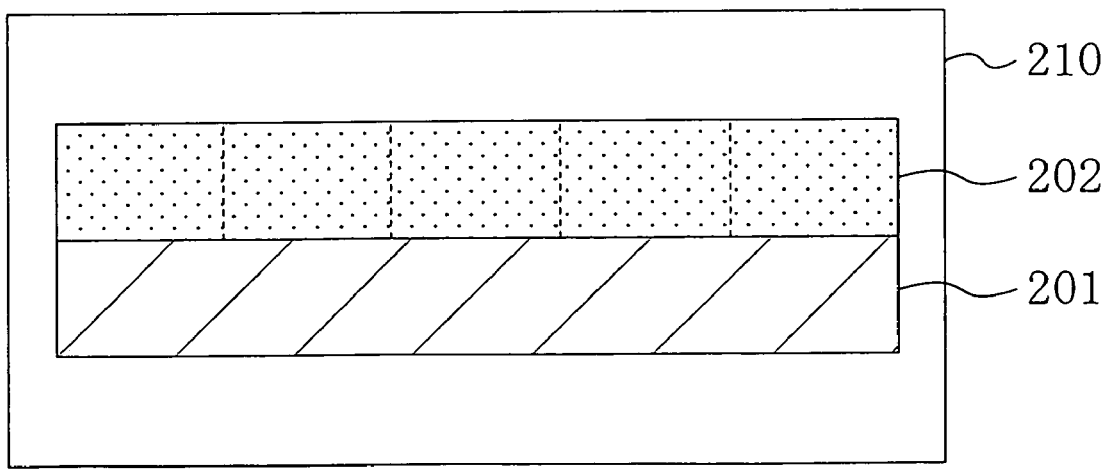

Next, as shown in FIG. 6C, after discharging the liquid 203 from above the resist film 202, the wafer 201 is moved to be positioned in a warming vessel 210 in which the atmosphere is warmed to approximately 33° C. Thus, drops of the liquid remaining on the top face of the exposed resist film 202 are dried through warming.

Figure 7A:
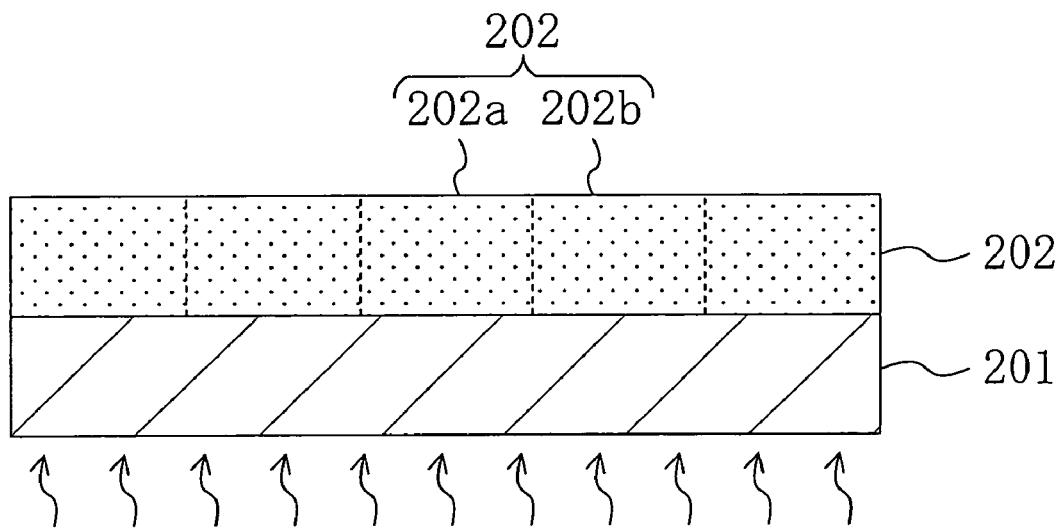
FIGS. 7A and 7B are cross-sectional views for showing other procedures in the pattern formation method using the exposure system according to Embodiment 3 of the invention.
Figure 7B:
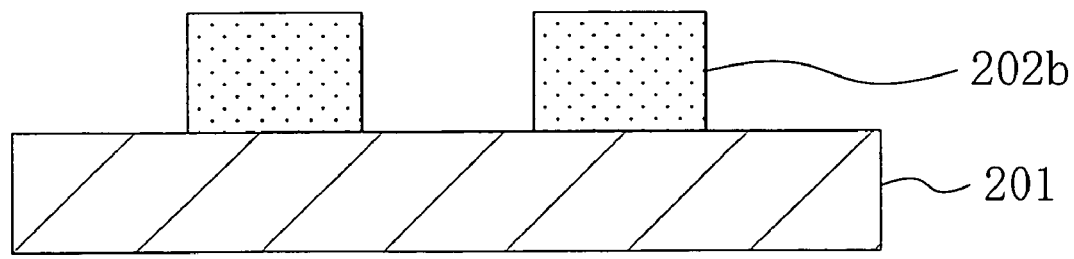
Figure 8A:
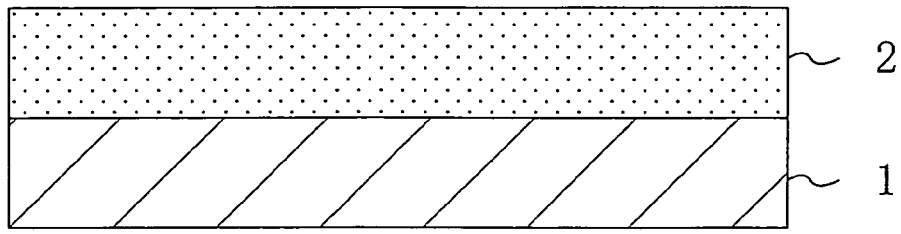
FIGS. 8A, 8B, 8C and 8D are cross-sectional views for showing procedures in a conventional pattern formation method employing immersion lithography.
Figure 8B:
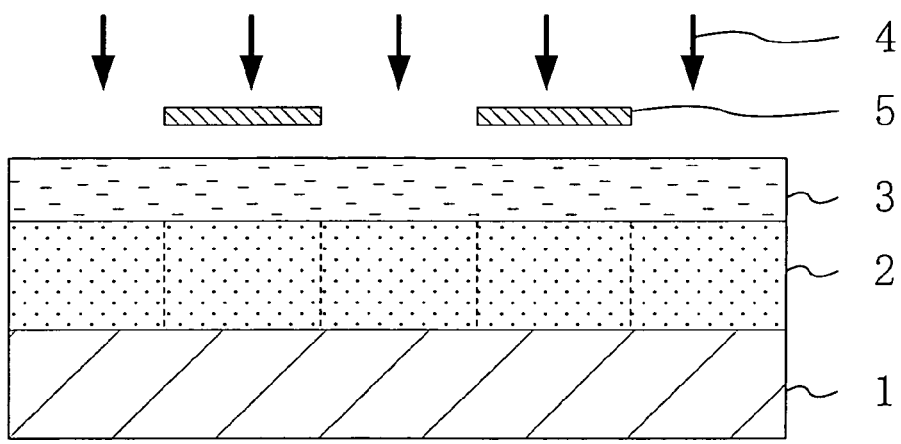
Figure 8C:
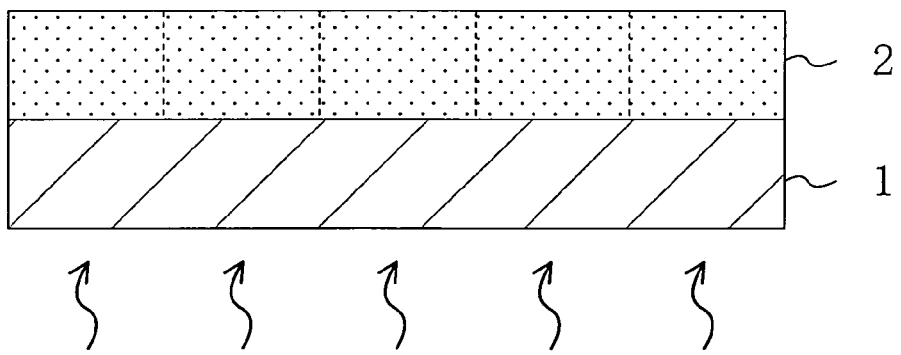
Figure 8D:
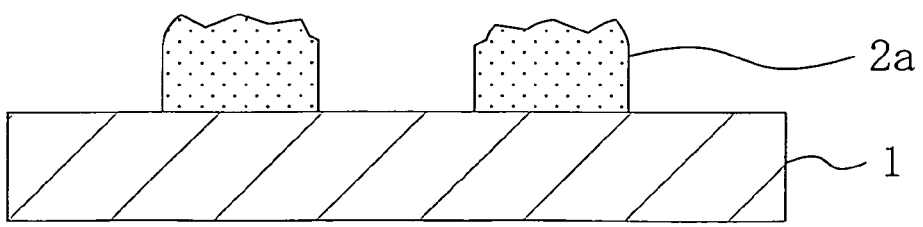
Figure 9A:
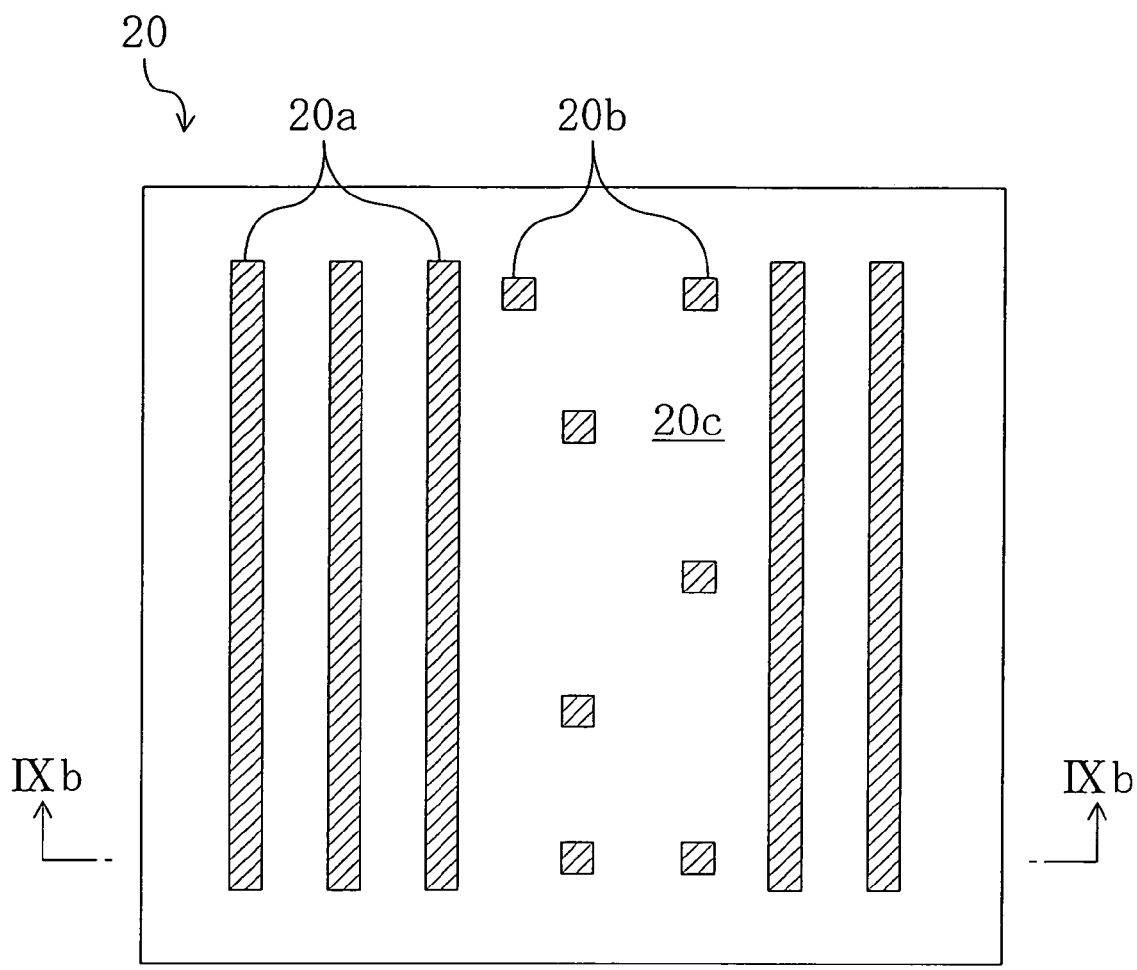
Figure 9B:
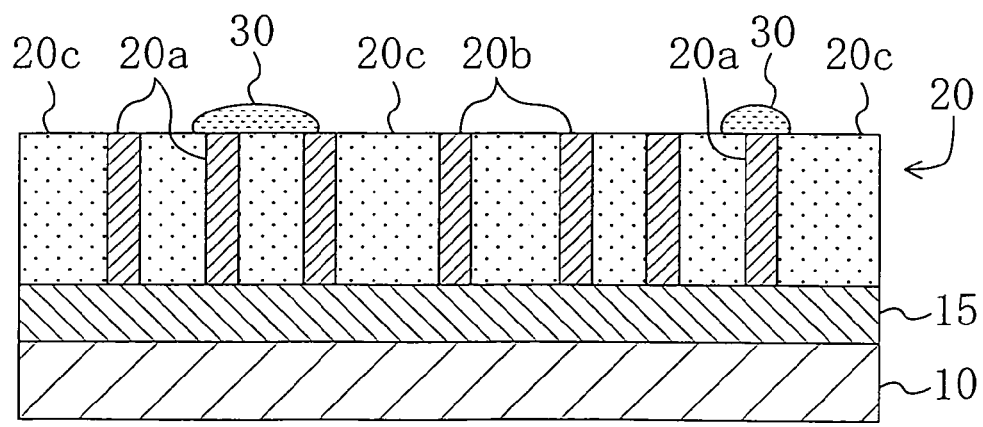

Next, as shown in FIG. 7A, the resist film 202, whose surface has been dried after the exposure, is baked with a hot plate at a temperature of 105° C. for 60 seconds, and thereafter, the resultant resist film 202 is developed with a 0.26 N tetramethylammonium hydroxide aqueous solution (alkaline developer). In this manner, a resist pattern 202b made of an unexposed portion of the resist film 202 and having a line width of 0.09 μm is formed as shown in FIG. 7B.

In this manner, according to the pattern formation method of Embodiment 3, after the pattern exposure through the immersion liquid 203, the drops remaining on the resist film 202 are dried through the warming, and therefore, the resist film 202 can be prevented from being deteriorated by the drops after the exposure. Accordingly, degradation of the pattern shape derived from insufficient dissolution in the developer of an exposed portion 202a of the resist film 202 or unwanted dissolution of the unexposed portion can be prevented, resulting in obtaining the resist pattern 202b in a good shape.

As the means for warming the exposed resist film 202, for example, a heater provided within the warming vessel 210 may be used. Alternatively, the warming vessel 210 for warming the wafer 201 is not always necessary as far as the temperature of the atmosphere covering the resist film 202 can be, for example, not less than room temperature (23° C.) and not more than 60° C., which does not limit the invention.

Although a positive resist is used in each of Embodiments 1 through 3, the present invention is applicable to a negative resist.

Although water is used as the immersion liquid in each embodiment, perfluoropolyether may be used instead of water. Moreover, a surfactant may be added to the immersion liquid.

Although the ArF excimer laser is used as the exposing light for the pattern exposure in each embodiment, KrF excimer laser, $Xe_2$ laser, $F_2$ laser, KrAr laser, $Ar_2$ laser or the like may be used instead.

As described so far, according to the exposure system and the pattern formation method of this invention, a resist can be prevented from being deteriorated by an immersion liquid remaining on the resist, and hence, a resist pattern can be formed in a good shape. Thus, the invention is useful as, for example, an exposure system and a pattern formation method using the same for use in fabrication process or the like for semiconductor devices.

What is claimed is:

1. A pattern formation method comprising the steps of:

forming a resist film on a substrate;

performing pattern exposure by selectively irradiating said resist film with exposing light with an immersion liquid provided on said resist film;

blowing air against said resist film after the pattern exposure;

discharging the air to the outside of a chamber; and forming a resist pattern by developing said resist film after blowing air against said resist film.

2. The pattern formation method of claim 1, wherein said air is warm air.

3. The pattern formation method of claim 1, wherein said immersion liquid is water or perfluoropolyether.

4. The pattern formation method of claim 1, wherein said exposing light is KrF excimer laser, $Xe_2$ laser, ArF excimer laser, $F_2$ laser, KrAr laser or $A_2$ laser.

5. The pattern formation method of claim 1, wherein the step of performing pattern exposure includes the sub-step of filling said immersion liquid between said resist film and said projection lens.

6. A pattern formation method comprising the steps of:

forming a resist film on a substrate;

performing pattern exposure by selectively irradiating said resist film with exposing light with an immersion liquid provided on said resist film;

dehumidifying an atmosphere around said resist film after the pattern exposure; and forming a resist pattern by developing said resist film after dehumidification.

7. The pattern formation method of claim 6, wherein the atmosphere is dehumidified by using a refrigerant.

8. The pattern formation method of claim 6, wherein the atmosphere is dehumidified by using a drying agent.

9. The pattern formation method of claim 6, wherein said immersion liquid is water or perfluoropolyether.

10. The pattern formation method of claim 6, wherein said exposing light is KrF excimer laser, $Xe_2$ laser, ArF excimer laser, $F_2$ laser, KrAr laser or $Ar_2$ laser.

11. A pattern formation method comprising the steps of:

forming a resist film on a substrate;

performing pattern exposure by selectively irradiating said resist film with exposing light with an immersion liquid provided on said resist film;

warming said resist film in a warming vessel after the pattern exposure; and forming a resist pattern by developing said resist film after warming said resist film.

12. The pattern formation method of claim 11, wherein said resist film is warmed by warming an atmosphere around said resist film.

13. The pattern formation method of claim 11, wherein said immersion liquid is water or perfluoropolyether.

14. The pattern formation method of claim 11, wherein said exposing light is KrF excimer laser, $Xe_2$ laser, ArF excimer laser, $F_2$ laser, KrAr laser or $Ar_2$ laser.

* * * * *